United States Patent [19]

Sakamoto et al.

[11] Patent Number: 5,788,830
[45] Date of Patent: Aug. 4, 1998

[54] ELECTROPLATING PROCESS

[75] Inventors: Yoshihiro Sakamoto; Toshio Tanimura; Minoru Outani, all of Amagasaki, Japan

[73] Assignee: MEC Co., Ltd., Amagasaki, Japan

[21] Appl. No.: 697,127

[22] Filed: Aug. 20, 1996

[30] Foreign Application Priority Data

Aug. 23, 1995 [JP] Japan ............... 7-214869
Jan. 18, 1996 [JP] Japan ............... 8-006696

[51] Int. Cl.$^6$ .............. C23C 28/00; C25D 5/02; C25D 5/54; C25D 5/56
[52] U.S. Cl. .............. 205/183; 205/125; 205/159; 205/162; 205/163; 205/164; 205/165; 205/166
[58] Field of Search .............. 205/125, 159, 205/162, 163, 164, 165, 166, 183, 188

[56] References Cited

U.S. PATENT DOCUMENTS

| | | | |
|---|---|---|---|
| 4,378,270 | 3/1983 | Brasch | 156/659.1 |
| 4,401,509 | 8/1983 | Schellinger, Jr. | 156/666 |
| 4,964,959 | 10/1990 | Nelsen et al. | 205/125 |
| 5,207,888 | 5/1993 | Bladon | 205/125 |
| 5,547,558 | 8/1996 | Sakamoto et al. | 205/125 |

FOREIGN PATENT DOCUMENTS 44 02 413  8/1994  Germany.

*Primary Examiner*—Kathryn L. Gorgos
*Assistant Examiner*—Edna Wong
*Attorney, Agent, or Firm*—Oblon, Spivak, McClelland, Maier & Neustadt, P.C.

[57] ABSTRACT

A process for electroplating a surface comprising copper and an insulating material, comprising: applying specific carbon particles or a palladium compound to this surface, microetching the copper to remove the specific carbon particles or the palladium compound, and providing electroplating. The process is characterized by using an aqueous solution comprising 5 to 60 wt % of sulfuric acid, 3 to 35 wt % of hydrogen peroxide, 0.01 to 10 wt % of a phosphonic group-containing amine or a salt thereof, and, optionally, 0.1 to 10 wt % of an amine other than the phosphonic group-containing amine, as a microetching agent. This process can ensure highly reliable electroplating to inner walls of printing wiring board through-holes.

6 Claims, No Drawings

5,788,830

ELECTROPLATING PROCESS

BACKGROUND OF THE INVENTION

1. Field of the Invention

The present invention relates to an electroplating process useful for electroplating a surface comprising copper or a copper alloy (hereinafter collectively referred to as copper) and an insulating material, and, more particularly, to an electroplating process useful for electroplating through-holes in printed-wiring boards.

2. Description of the Background Art

In printed-wiring boards such as double-sided boards and multilayer boards, through-holes are provided in the substrate. The inner walls of the through-holes are electroplated to connect the circuits provided on both sides of the substrate (the double-sided board) or the circuits in various layers of the substrates (the multilayer board).

Because the circuits are separated from one other by insulating materials, the inner wall surface is made of alternate laminations of conductive materials and insulating materials. Therefore, the through-hole inner walls cannot be directly electroplated. Electroplating therefore is conventionally performed after electroless copper plating. However, the electroless plating has the following drawbacks: (1) it requires a comparatively long period of time, (2) a number of baths must continuously be monitored during the plating process (required components must be supplied to each bath and sufficient care must be taken so that the baths are not contaminated with components used in the preceding steps, because the baths are extremely sensitive to contamination), (3) a number of washing baths are needed and these baths consume a great quantity of water for washing, and (4) waste water disposal is expensive.

As a method for electroplating without using the electroless plating which has these drawbacks, the inventors of the present invention have proposed a process for electroplating comprising forming a conductive graphite layer over the inner wall of the through-holes, removing the graphite layer produced only on the copper layer, and electroplating the through-hole inner surface (Japanese Patent Application Laid-Open No. 280089/1994, GB 2274853, DE 4402413).

Japanese Patent Applications Laid-Open No. 504167/1993 and 330378/1994 disclose a process for electroplating after forming a conductive layer of palladium colloid or a palladium compound on the surface of insulating material.

The process of Japanese Patent Applications Laid-Open No. 280089/1994 ensures formation of highly reliable plating films by directly electroplating the through-hole inner walls without using electroless plating. However, depending on working conditions, the process entails production of voids where no metals are attached to the through-hole inner walls and leaves inner layer contaminants of graphite films on the inner copper surface of the multiple-layered substrate. Films electroplated on the voids or inner layer contaminants may be peeled off by heat shock. Similar problems are encountered also in the process using a noble metal disclosed by Japanese Patent Applications Laid-Open No. 504167/1993 and 330378/1994.

The present inventors have under taken extensive studies to increase the reliability of films obtained by the electroplating process of Japanese Patent Applications Laid-Open No. 280089/1994 and have found a microetching agent which can be used with very high efficiency for removing the above-mentioned graphite layer or palladium layer. This finding led to the completion of the present invention.

SUMMARY OF THE INVENTION

Accordingly, an object of the present invention is to provide a process for electroplating a surface comprising copper or a copper alloy and an insulating material, comprising:

(a) applying an aqueous dispersion containing graphite particles with an average particle diameter of 2 µm or less or carbon black particles with an average particle diameter of 1 µm or less, or both to said surface to be electroplated, thereby causing said graphite or carbon black particles to become attached to said surface, (b) removing said graphite or carbon black particles from the copper or copper alloy by etching a layer of copper or copper alloy using a microetching agent which is an aqueous solution comprising 5 to 60 wt % of sulfuric acid, 3 to 35 wt % of hydrogen peroxide, and 0.01 to 10 wt % of a phosphonic group-containing amine or a salt thereof, and (c) electroplating using a layer consisting of the copper or copper alloy with said graphite or carbon black particles having been removed and the remaining graphite or carbon black as a conductive layer.

Another object of the present invention is to provide a process for electroplating a surface comprising copper or a copper alloy and an insulating material, comprising:

(a) applying an aqueous solution or an aqueous dispersion containing a palladium compound to cause the palladium compound to be attached to said surface, (b) removing the palladium compound from the copper or copper alloy by etching a layer of the copper or copper alloy using a microetching agent which is an aqueous solution comprising 5 to 60 wt % of sulfuric acid, 3 to 35 wt % of hydrogen peroxide, and 0.01 to 10 wt % of a phosphonic group-containing amine or a salt thereof, and (c) electroplating using a layer consisting of the copper or copper alloy with the said palladium compound having been removed and the remaining palladium compound as a conductive layer.

In a preferred embodiment of the above processes, the said aqueous solution of the microetching agent further comprises 0.1 to 10 wt % of an amine other than the phosphonic group-containing amine.

These and other objects, features, and advantages of the present invention will become more apparent from the following description of the preferred embodiments.

DETAILED DESCRIPTION OF THE INVENTION AND PREFERRED EMBODIMENTS

The microetching agent used in the present invention will be described in detail.

This microetching agent contains 5 to 60 wt %, preferably 10 to 40 wt %, of sulfuric acid. If the sulfuric acid content is less than 5 wt %, the copper surface may be soiled when the hydrogen peroxide content is high. This may cause inadequate electroplating. A sulfuric acid content of more than 60 wt % tends to produce a precipitate of copper sulfate.

The hydrogen peroxide content in the microetching agent is 3 to 35 wt %, and preferably 5 to 25 wt %. If less than 3 wt %, inner contaminants may remain; if more than 35 wt %, voids tend to be produced.

A phosphonic group-containing amine or a salt thereof is added to the microetching agent to make it easy to control the rate of etching by suppressing the etching speed.

Examples of the phosphonic group-containing amine include nitrilo-diacetic acid (methylenephosphonic acid), nitrilo-acetic acid-di(methylenephosphonic acid), nitrilo-tri (methylenephosphonic acid), ethylenediamine-N,N'-di (methylenephosphonic acid), ethylenediamine-N,N'-diacetic acid-di(methylenephosphonic acid), ethylenediamine-tetra(methylenephosphonic acid), cyclohexane-1,2-diamino-tetra(methylenephosphonic acid), and N,N'-bis(2-hydroxybenzyl)ethylenediamine-N,N'-bis (methylenephosphonic acid). Sodium salts and potassium salts are given as specific examples of the salts of the phosphonic group-containing amines. These phosphonic group-containing amines or the salts may be used either individually or in combination of two or more. The content of the phosphonic group-containing amines or the salts in the microetching agent is 0.01 to 10 wt %, and preferably 0.01 to 7 wt %. If less than 0.01 wt %, voids may be easily produced; if more than 10 wt %, unevenness in color or discoloration may be produced on the copper surface.

Amines other than the phosphonic group-containing amines may also be added to the microetching agent to prevent re-oxidation of the surface after etching. Various amines used in conventional copper etching agents for the purpose of preventing re-oxidation, side etching, or decomposition of hydrogen peroxide may be used without any specific limitation. Specific examples of such amines include monoethylamine, monobutylamine, dibutylamine, tributylamine, ethylhexylamine, cyclohexylamine, diphenylamine, monoethanolamine, diethanolamine, triethanolamine, ethylenediamine, and alkylene oxide addition compounds to these amines (e.g. ethylene oxide addition compounds of cyclohexylamine, polyoxypropylene ethylenediamine, N-(β-aminoethyl)-ethanolamine, N-(β-aminoethyl)propanolamine, and tetra(2-hydroxypropyl) ethylenediamine).

These amines other than the phosphonic group-containing amines may be used either individually or in combination of two or more, in an amount of 0.1 to 10 wt %, and preferably 0.1 to 3 wt %. If less than 0.1 wt %, unevenness in color or discoloration may be produced on the copper surface; if more than 10 wt %, voids may be easily produced.

Other additives such as a stabilizer for hydrogen peroxide, surfactant, defoaming agent, and organic solvents may be optionally incorporated into the composition of the present invention.

Of the electroplating processes of the present invention using the above-described microetching agent, the process using an aqueous dispersion containing graphite particles with an average particle diameter of 2 μm or less and/or carbon black particles with an average particle diameter of 1 μm or less (the graphite particles and carbon black particles are hereinafter collectively referred to as "specific carbon particles") for producing a conductive layer will be illustrated.

In this electroplating process, the surface to be electroplated, i.e. the surface comprising copper and an insulating material, is caused to come in contact with an aqueous dispersion containing the specific carbon particles, to attach the specific carbon particles to the entire surface (step (a)).

A typical example of the material having such a surface comprising copper and an insulating material which is used in the present invention is a substrate for a printed wiring board. Paper-based phenol resin copper laminated boards, glass-based epoxy resin copper laminated boards, composite copper laminated boards, polyimide copper laminated boards, fluorine-containing resin copper laminated boards, and copper laminated boards for flexible circuits are given as examples of the substrate for printed wiring boards.

The graphite particles in the specific carbon particles are superfine particles with an average diameter of 2 μm or less, preferably 1 μm or less, and more preferably 0.7 μm or less. If the average diameter is greater than 2 μm, not only is the conductivity lowered, but also the attachability of a conductive metal to be electroplated to the nonconductive surface is poor. As the carbon black particles, superfine particles with an average diameter of 1 μm or less, preferably 0.5 μm or less, and more preferably 0.3 μm or less, are used. If the average diameter is greater than 1 μm, voids may increase, resulting in a decrease in the reliability of the electroplating. Any specific carbon particles having a particle size not exceeding these upper-side limits can be used, with no specific limitations to the lower-side limits. The graphite particles and the carbon black particles can be used either independently or in combination.

The amount of the specific carbon particles in the aqueous dispersion is preferably 1 to 6%. If less than 1%, the density of the graphite particles or the carbon black particles in the formed layer is too small for this layer to be sufficiently conductive; if greater than 6%, the attachability of a conductive metal to be electroplated to the nonconductive surface is poor.

Various components other than the specific carbon particles may be optionally incorporated in the aqueous dispersion of these particles. Such components include binders for increasing the attachability of the specific carbon particles to the nonconductive surfaces, surfactants for promoting the attachability of the specific carbon particles and stability of the dispersion, water-soluble polymers for increasing the stability of the dispersion, and the like.

Either organic or inorganic binders can be used as the binder, with the inorganic binders, such as sodium silicate and potassium silicate, being more preferred. The amount of binder contained in the aqueous dispersion is usually in the range of 0.05 to 5%. If the amount of binder is too large, the conductivity and film-forming capability are decreased.

As the surfactants, anionic surfactants, such as carboxylic acid-type surfactants, polycarboxylic acid-type surfactants, naphthalene sulfonic acid-type surfactants and neutral phosphate-type surfactants, can be used. Nonionic surfactants and cationic surfactants may also be used depending on the conditions of dispersion. The water-soluble polymers which can be added to the aqueous dispersion include, for example, carboxymethyl cellulose, starch, and gum arabic. Furthermore, the aqueous dispersion of the specific carbon particles is preferably adjusted to about pH 9–13 with the addition of aqueous ammonia, sodium hydroxide, potassium hydroxide, or the like, preferably ammonia.

The aqueous dispersion of graphite particles can be prepared by the wet process comprising pulverization, dispersion, and classification. This method is preferable for improving dispersion stability and narrowing the size distribution of the graphite particles.

In order to apply the aqueous dispersion of specific carbon particles to the surface of the treated material, any procedure such as spraying, dipping, or coating can be employed with no specific limitations.

Next, among the specific carbon particles attached to the surface, those on the copper surface are selectively removed by etching the copper surface using the above-mentioned microetching agent (step (b)). Among the specific carbon particles attached to the surface, i.e. the copper surface and the surface of the insulating material, those on the copper surface decrease the attachability of the metal to be electroplated to the copper. In addition, because the specific carbon particles have a lower conductivity than the copper, the specific carbon particles act as an electric resistance. For these reasons, these specific carbon particles on the copper must be removed. In this removal operation, the microetching agent does not directly act on the specific carbon particles, but removes the specific carbon particles by etching the copper surface present underneath these specific carbon particles. Accordingly, the specific carbon particles attached to the surface of the insulating material remain without being removed by this treatment.

A dipping method, a jet method, and a spray method are given as the treating method using the microetching agent, but the present invention is not limited to these. Among these treating methods, the jet method is particularly preferred. The thickness of the copper surface removed by etching is preferably 1.0 μm or less, and more preferably 0.7 μm or less, and particularly preferably 0.5 μm or less. In the case of over-etching of copper wherein the etching thickness is greater than 1.0 μm, the conductivity between the copper and the specific carbon particles on the surface of the insulating material is lost, leading to production of voids. Thus, in general, the smaller the etching thickness, the better the result. In the case where a conventional microetching agent is used, however, a thin etching cannot sufficiently remove the specific carbon particles attached to the copper surface, so that the above-described effects cannot be obtained. The use of the microetching agent of the present invention can ensure complete removal of the specific carbon particles even with a very slight etching of the copper and, hence, ensures highly reliable electroplating without voids and inner contaminants.

Next, a metal is electroplated using the copper surface layer from which the specific carbon particles have been removed and the layer of specific carbon particles attached to the insulating material as the conductive layers (step (c)).

There are no specific limitations as to the method of electroplating. For example, the electroplating can be carried out at a normal temperature and at 1.5 to 3 A/dm$^2$ for 60 to 90 minutes in a common electroplating bath. There are also no specific limitations to the conductive metal used for the electroplating. Various metals, such as copper and nickel, are used, depending on the application.

The process of the present invention can be applied to electroplating of various materials in which copper and insulating materials are present together, such as various printed wiring boards. Since the attachability using the electroplating method of the present invention is excellent, it can produce evenly attached and highly reliable electroplating on even the internal walls of through-holes, called via holes, which are holes with a diameter of 0.1 to 0.5 mm, for which the electroplating has heretofore been difficult.

Typical steps adopted for applying electroplating using the process of the present invention to through-hole internal walls of a printed-wiring board are now illustrated taking the case where electroplating is performed on through-hole internal walls of a substrate with copper foil laminated over both sides thereof (a glass-based epoxy resin copper laminated board).

(1) Washing of substrate surface

This is a treatment to clean the through-hole inner walls, and comprises washing the board with a weakly alkaline solution of about pH 9–12 containing an anionic surfactant such as a phosphoric acid ester at 35°–65° C. for about 20 to 60 seconds, and rinsing with water.

(2) Conditioning treatment

This is a treatment to accelerate attachment of the specific carbon particles to the cleaned surfaces of through-hole inner walls, and normally comprises treatment with a weakly alkaline solution of about pH 9–12 containing a cationic surfactant of a polyamine-type, polyamide-type, or the like at 20°–60° C. for about 20 to 60 seconds, and rinsing with water.

(3) Application of the specific carbon particles

The board is dipped into the aqueous dispersion containing the specific carbon particles, normally, at 20°–60° C. for about 30 to 90 seconds, to cause the specific carbon particles to be attached to the surfaces of the substrate.

(4) Acid treatment

The board is dipped into a strongly acidic aqueous solution at 20°–60° C. for about 30 to 100 seconds, washed with water, and dried. This treatment causes the specific carbon particles which are attached to the substrate surface to coagulate and reduces the electric resistance, thereby increasing attachability of the electroplating metal.

(5) Microetching

The board is dipped into the microetching agent solution at 10° to 30° C. for about 5 to 30 seconds to provide etching to a depth of 1.0 μm or less, washed with water, and dried. Washing is carried out first by spraying water, then by washing using a small pore washing machine suitable for washing small pores disclosed in Japanese Utility Model Application Laid-Open No. 26879/1989.

(6) Electroplating

Electroplating can be carried out under conditions of normal temperature and at 1.5 to 3 A/dm$^2$ for 60 to 90 minutes in a common electroplating bath.

It is possible to combine said step (1) for washing the substrate surface and step (2) for the conditioning treatment. In this instance, the board may be treated with a weakly alkaline solution of about pH 9–12 containing a cationic surfactant such as polyamine-type and polyamide-type and a solvent such as ethanolamine at 20° to 60° C. for about 20 to 60 seconds, and rinsed with water.

Next, the electroplating process wherein a conductive layer is formed using a palladium compound on the surface of the insulating material is illustrated.

This electroplating process is a process known as the palladium direct plating method in the technical field of printed wiring boards. The process of the present invention is characterized by using the above-described microetching agent in the microetching step for removing the palladium layer on the copper surface. Accordingly, the same procedure as in the conventional palladium direct plating method is applied up to the point where the palladium compound is attached. The same palladium compounds as used in the conventional palladium direct plating method, such as a colloid containing palladium chloride and tin chloride, a colloid containing palladium sulfate, a colloid containing palladium chloride and polyvinyl pyrrolidone, and various types of palladium complexes, can be used.

Then, the palladium compound is removed using the above-mentioned microetching agent. The etching thickness is the same as in the case of the specific carbon particles, i.e. preferably 1.0 μm or less, and more preferably 0.7 μm or less, and particularly preferably 0.5 μm or less. A dipping method, a jet method, and a spray method are given as the treating method using the microetching agent, with the jet method being preferred.

The electroplating is carried out after removal of the palladium compound according to the conventional method.

This electroplating process using the palladium compound is suitably applied to electroplating the inner walls of through-holes of printed wiring boards. The same method for electroplating as in the previously described process using the specific carbon particles can be applied except for using the palladium compound instead of the specific carbon particles.

Other features of the invention will become apparent in the course of the following description of the exemplary embodiments which are given for illustration of the invention and are not intended to be limiting thereof. In the examples below, "% by weight" is simply referred to as "%".

EXAMPLES

Example 1

A substrate (10 cm×25 cm×1.6 mm) consisting of five insulating layers of a glass fiber base material impregnated with epoxy resin and six copper foils with a thickness of 35 µm, alternately laminated with copper foils on both external sides, which is provided with about 960 through-holes with a diameter of 0.3 to 0.8 mm, was processed as follows.

The substrate was dipped into a solution consisting of 0.5% of a cationic surfactant, 1.0% of amine, and the balance water (a cleaner conditioner) at 45° C. for 40 seconds, followed by washing with water (washing and conditioning). The substrate was then dipped into a graphite dispersion consisting of 4.0% of graphite particles having an average particle diameter of 0.4 µm, 0.5% of carboxymethyl cellulose, 0.5% of sodium silicate, 1.0% of an anionic surfactant, and the balance water, adjusted to pH 10 with ammonia, at 25° C. for 60 seconds. The substrate was then dipped in an aqueous solution containing 10% of a sulfuric acid (62.5% sulfuric acid)solution and the balance water with a pH of 0.2 at 20° C. for 30 seconds, followed by washing (acid treatment). Next, the substrate was dipped into a microetching agent solution with the composition shown in Table 1 at 25° C. for 15 seconds, and washed with spray water, then by a small pore washing machine, and dried (microetching). Copper was etched to a depth of 0.2 µm by this microetching treatment.

Next, the substrate was electroplated at a current density of 2 A/dm$^2$ for 90 minutes at 25° C. using a conventional copper plating bath.

The presence or absence of voids in the resulting electroplated substrate was determined by a backlight test and observation of the cross-section. The results are shown in Table 1. In addition, the joining conditions of the substrate and the plated film were examined after heat shock by a solder shock test according JIS C5012 (oil was replaced by solder at 260°–265° C. and the test was carried out at 10 cycles). The results are shown in Table 1.

Example 2–5

The substrates were treated and evaluated in the same manner as in Example 1 except that the microetching agents shown in Table 1 were used. The results are shown in Table 1.

Example 6

The substrates were treated and evaluated in the same manner as in Example 1, except that a carbon black dispersion consisting of 3% of carbon black particles having an average particle diameter of 0.1 µm, 1% of a cationic surfactant, and the balance water, and adjusted to pH 10 with potassium hydroxide, was used, instead of the graphite dispersion. The results are shown in Table 1.

Comparative Example 1

The substrates were treated and evaluated in the same manner as in Example 1 except that the microetching agent solution shown in Table 1 was used. The results are shown in Table 1. In this Comparative Example, the solder shock was omitted, because there were voids in the electroplated film.

TABLE 1

| Composition of microetching agent (%) | | Voids | Joining conditions |
|---|---|---|---|
| Example 1 | | | |
| Sulfuric acid | 25 | None | Good |
| Hydrogen peroxide | 20 | | |
| N-(β-aminoethyl)propanolamine | 1 | | |
| Ethylenediaminetetra(methylene-phosphonic acid) | 1 | | |
| Ion exchanged water | Balance | | |
| Example 2 | | | |
| Sulfuric acid | 50 | None | Good |
| Hydrogen peroxide | 35 | | |
| Tri-isopropanolamine | 1 | | |
| Ethylenediamine-N-N'-di-(methylenephosphonic acid) | 10 | | |
| Ion exchanged water | Balance | | |
| Example 3 | | | |
| Sulfuric acid | 5 | None | Good |
| Hydrogen peroxide | 3 | | |
| Cyclohexylamine | 0.1 | | |
| Cyclohexane-1,2-diaminetetra-(methylenephosphonic acid) | 0.05 | | |
| Ion exchanged water | Balance | | |
| Example 4 | | | |
| Sulfuric acid | 30 | None | Good |
| Hydrogen peroxide | 10 | | |
| Tetra(2-hydroxypropyl)-ethylenediamine | 7 | | |
| Ethylenediamine-N-N'-diacetic acid-N,N'-di(methylenephosphonic acid) | 5 | | |
| Ion exchanged water | Balance | | |
| Example 5 | | | |
| Sulfuric acid | 10 | None | Good |
| Hydrogen peroxide | 30 | | |
| Hydroxyethyldiaminopropane | 1 | | |
| Nitrilotri(methylenephosphonic acid).5Na | 10 | | |
| Ion exchanged water | Balance | | |
| Example 6 | | | |
| Sulfuric acid | 25 | None | Good |
| Hydrogen peroxide | 20 | | |
| N-(β-aminoethyl)propanolamine | 1.0 | | |
| Ethylenediaminetetra(methylene-phosphonic acid) | 1.0 | | |
| Ion exchanged water | Balance | | |
| Comparative Example 1 | | | |
| Sulfuric acid | 10 | Voids | — |
| Hydrogen peroxide | 30 | | |
| Hydroxyethyldiaminopropane | 1.0 | | |
| Ion exchanged water | Balance | | |

Example 7–8

The substrates were treated and evaluated in the same manner as in Example 1 except that the microetching agent solutions shown in Table 2 were used. The results are shown in Table 2.

TABLE 2

| Composition of microetching agent (%) | | Voids | Joining conditions |
|---|---|---|---|
| Example 7 | | | |
| Sulfuric acid | 25 | None | Good |
| Hydrogen peroxide | 20 | | |
| Aminotri(methylenephosphonic acid) | 1 | | |
| Ion exchanged water | Balance | | |
| Example 8 | | | |
| Sulfuric acid | 20 | None | Good |
| Hydrogen peroxide | 25 | | |
| Ethylenediaminetetra(methylene-phosphonic acid) | 1 | | |
| Ion exchanged water | Balance | | |

Example 9

Electroplating was carried out according to the Krimson method of Shipley Co., except that the microetching agent solution consisted of 20% of sulfuric acid, 25% of hydrogen peroxide, 1% of ethylenediamine tetra (methylenephosphonic acid), and the balance water were used. The electroplating experiment was carried out as follows.

The substrate used in Example 1 was dipped into a sensitizer at 45° C. for five minutes and washed with water, then into a pre-activator at 25° C. for two minutes, and further into an activator at 45° C. for five minutes. After dipping into a converter at 25° C. for four minutes, the substrate was washed with water and dipped into an enhancer at 25° C. for one minute, followed by washing with water. Next, the substrate was dipped into a stabilizer at 25° C. for two minutes and washed with water.

Then, after dipping into the above-mentioned microetching agent solution at 25° C. for 15 seconds, the substrate was washed with spray water and by using a small pore washing machine, followed by drying. The copper was etched as deep as 0.2 μm by this microetching treatment.

The resulting substrate was electroplated in the same manner as in Example 1 and evaluated. No voids were found and the joining conditions of the substrate and the plated film was excellent.

Based on the above results, the electroplating process of the present invention using a specific microetching agent was proven to provide electroplating which is highly reliable and without any voids and inner contaminants in the through-holes of the printed wiring boards.

The process of the present invention can ensure highly reliable electroplating of materials containing copper and an insulating material exposed on the surface, and is particularly applicable to electroplating multi-layer printed-wiring boards having small pores.

Obviously, numerous modifications and variations of the present invention are possible in light of the above teachings. It is therefore to be understood that within the scope of the appended claims, the invention may be practiced otherwise than as specifically described herein.

What is claimed is:

1. A process for electroplating a surface comprising copper or copper alloy surfaces and insulating material surfaces, comprising:

(a) applying an aqueous dispersion containing graphite particles with an average particle diameter of 2 μm or less, or carbon black particles with an average diameter of 1 μm or less or both to said surfaces to be electroplated comprising the copper or copper alloy surfaces and the insulting material surfaces, to cause said graphite or carbon black particles to become attached to said surfaces, and to form a conductive layer on the insulating material surfaces, (b) selectively removing said graphite or carbon black particles from the copper or copper alloy surfaces by microetching the surfaces of the copper or copper alloy upon which said graphite or carbon black particles are attached with a microetching agent which is an aqueous solution comprising 5 to 60 wt % of sulfuric acid, 3 to 35 wt % of hydrogen peroxide, and 0.01 to 10 wt % of a phosphonic group-containing amine or a salt thereof without removing the graphite or carbon black particles attached to the insulating material surfaces, and (c) electroplating the copper or copper alloy surfaces from which said graphite or carbon black particles have been removed and the graphite or carbon black particles attached to the insulating material surfaces material as a conductive layer.

2. The process according to claim 1, wherein said aqueous solution of the microetching agent further comprises 0.1 to 10 wt % of an amine other than the phosphonic group-containing amine.

3. A process for electroplating a surface comprising copper or copper alloy surfaces and insulating material surfaces, comprising:

(a) applying an aqueous solution or an aqueous dispersion containing a palladium compound to cause the palladium compound to be attached to said surface comprising the copper or copper alloy surfaces and the insulating material surfaces and to form a conductive layer on the insulating material surfaces, (b) selectively removing the palladium compound from the surfaces of the copper or copper alloy by microetching the copper or copper alloy surfaces upon which said palladium compound is attached with a microetching agent which is an aqueous solution comprising 5 to 60 wt % of sulfuric acid, 3 to 35 wt % of hydrogen peroxide, and 0.01 to 10 wt % of a phosphonic group-containing amine or a salt thereof without removing the palladium compound attached to the insulating material surfaces, and (c) electroplating the copper or copper alloy surfaces from which the palladium compound has been removed and the palladium compound attached to the insulating material surfaces as a conductive layer.

4. The process according to claim 3, wherein said aqueous solution of the microetching agent further comprises 0.1 to 10 wt % of an amine other than the phosphonic group-containing amine.

5. The process according to claim 1 or claim 3, wherein said microetching is carried out to a depth of 1.0 μm or less.

6. The process according to claim 1 or claim 3, wherein the surface comprising copper or copper alloy surfaces and insulating material surfaces is the surface of the wall of a through-hole in a printed-wiring board.

* * * * *